(12) United States Patent
Otsuka

(10) Patent No.: US 6,937,170 B2
(45) Date of Patent: Aug. 30, 2005

(54) VARIABLE-LENGTH DECODING APPARATUS AND METHOD, COMPUTER PROGRAM, AND COMPUTER-READABLE STORAGE MEDIUM

(75) Inventor: Katsumi Otsuka, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/814,510

(22) Filed: Apr. 1, 2004

(65) Prior Publication Data

US 2004/0196167 A1 Oct. 7, 2004

(30) Foreign Application Priority Data

Apr. 1, 2003 (JP) .......................... 2003-098040
Feb. 16, 2004 (JP) .......................... 2004-038815

(51) Int. Cl.[7] .............................................. H03M 7/40
(52) U.S. Cl. ............................................ 341/67; 382/246
(58) Field of Search ........................... 382/246; 341/67, 341/50, 51; 386/69; 348/700

(56) References Cited

U.S. PATENT DOCUMENTS

| 6,125,229 | A | * | 9/2000 | Dimitrova et al. ............. 386/69 |
| 6,137,544 | A | * | 10/2000 | Dimitrova et al. ........... 348/700 |
| 6,603,413 | B2 | | 8/2003 | Igarashi et al. ................ 341/67 |
| 2002/0090142 | A1 | | 7/2002 | Igarashi et al. .............. 382/246 |
| 2002/0122599 | A1 | | 9/2002 | Igarashi et al. .............. 382/239 |
| 2002/0164080 | A1 | | 11/2002 | Igarashi et al. .............. 382/233 |
| 2003/0058143 | A1 | | 3/2003 | Chiba et al. ................... 341/67 |
| 2003/0219164 | A1 | | 11/2003 | Otsuka ........................ 382/247 |
| 2004/0017855 | A1 | | 1/2004 | Otsuka ........................ 375/253 |

FOREIGN PATENT DOCUMENTS

JP 2003-115767 4/2003 ............ H03M/7/42

* cited by examiner

Primary Examiner—Jean Bruner Jeanglaude
(74) Attorney, Agent, or Firm—Fitzpatrick, Cella, Harper & Scinto

(57) ABSTRACT

This invention reduces the scale of a Huffman table used for decoding. A queuing unit queues a variable-length code word from a received bitstream. A switch circuit discriminates the type of the code word in accordance with the pattern of a predetermined number of bits at the start of the queued variable-length code word, extracts data having a sufficient code word length from a predetermined bit position on the basis of the discrimination result, and outputs the result to a Huffman table. The Huffman table compares the data from the switch circuit with a variable-length code word stored in advance, and when the data and the variable-length code word coincide, outputs first symbol data. The Huffman table also generates a sum value for the first symbol data, and generates two second symbols from the sum result. A selection unit selects and outputs one of the first symbol and two second symbols in accordance with the type of the received code. A selection unit selects and outputs one of the symbol selected by the selection unit and a symbol from an FLC decoder on the basis of the data queued by the queuing unit.

7 Claims, 9 Drawing Sheets

FIG. 7

|  | RUN | LEVEL |
|---|---|---|
| VLC METHOD | RUN+ | LEVEL+ |
| ESCL METHOD | RUN+ | (LEVEL+)+LMAX |
| ESCR METHOD | (RUN+)+RMAX | LEVEL+ |

FIG. 8

| Code | Run |
|---|---|
| 000 000 | 0 |
| 000 001 | 1 |
| 000 010 | 2 |
| . | . |
| . | . |
| 111 111 | 63 |

| Code | Level |
|---|---|
| forbidden | −2048 |
| 1000 0000 0001 | −2047 |
|  |  |
| 1111 1111 1110 | −2 |
| 1111 1111 1111 | −1 |
| forbidden | 0 |
| 0000 0000 0001 | 1 |
| 0000 0000 0010 | 2 |
|  |  |
| 0111 1111 1111 | 2047 |

VARIABLE-LENGTH DECODING APPARATUS AND METHOD, COMPUTER PROGRAM, AND COMPUTER-READABLE STORAGE MEDIUM

BACKGROUND OF THE INVENTION

1. Field of the Invention

The present invention relates to a technique for decoding variable-length code words for still images or moving images.

2. Background of the Invention

A method which uses an entropy encoding technique by run length/category encoding and variable-length encoding as one of the compression encoding techniques for still images or moving images is conventionally known well. This technique is employed even in JPEG (Joint Photographic Experts Group) encoding and MPEG-1/-2 (Moving Picture Experts Group) encoding as international standards. In these encoding methods, an event for executing variable-length encoding is caused by implementing entropy encoding by assigning a Huffman code to a two-dimensional event called a run length and level (e.g., Japanese patent Laid-Open No. 2003-115767). The two-dimensional event of run length and level will be referred to as a symbol.

A technique used for moving image compression encoding in recent years that has received a great deal of attention assigns a Huffman code to a three-dimensional event. This technique has already been standardized by an encoding method called H.263 or MPEG-4. As for a three-dimensional event, a "last" significant coefficient in a DCT block called last is taken into consideration in addition to the run length and level used in two-dimensional encoding. For this reason, even when the values of the run length and level are the same, a Huffman code to be assigned changes depending on the last significant coefficient in the DCT block. The three-dimensional event of run length, level, and last will also be referred to as a symbol.

In MPEG-4 encoding, when a symbol is not present in a predetermined Huffman code table, a fixed-length code called an escape is assigned. This also applies to MPEG-1/-2 encoding. In MPEG-4 encoding, when a symbol is not present in a Huffman code table, first, a new symbol is defined by subtracting the value of the maximum level in the Huffman code table from the value of the level of the symbol, and the Huffman code table is searched for again. When it is determined as a result of the search that the symbol is present in the Huffman code table, a corresponding Huffman code is assigned. If the symbol is not present in the Huffman code table, a new symbol is defined by subtracting a value corresponding to (maximum run length in Huffman code table +1) from the value of the run length, and the Huffman code table is searched for again. When it is determined as a result of the search that the symbol is present in the Huffman code table, a corresponding Huffman code is assigned. If the symbol is not present, a fixed-length code is assigned.

FIG. 2 shows a variable-length decoding apparatus corresponding to MPEG-4 encoding, which is disclosed in Japanese Patent Laid-Open No. 2003-115767. A portion corresponding to the block layer of a bitstream encoded by MPEG-4 encoding is input to a queuing means 201. The queuing means 201 includes a shifter circuit. The queuing means 201 sequentially discards a bitstream in accordance with a shift amount requested by an operation control means 207. In the output from the queuing means 201, the start of the code word in a block layer is always queued. The queuing means 201 executes the output operation in synchronism with a clock. The queued code word is input parallel to five blocks, i.e., a DC decoder 202, FLC decoder 203, Huffman table 204, Huffman table ESCR 205, and Huffman table ESCL 206.

The operation control means 207 asserts a DC data output signal to a functional block (not shown) on the output side to indicate that the result of decoding in the DC decoder 202 is effective by a code word when the value of the run length counted by a counter means (not shown) exceeds 64, and the last of symbol data output from a selection means 208 is "1" and indicates that it is the last significant coefficient. In other clock cycle, i.e., when symbol data corresponding to an AC coefficient is decoded, the DC data output signal is negated to indicate that the output of the symbol data signal is effective.

Decoding processing of symbol data corresponding to the AC coefficient is done by the four blocks, i.e., the FLC decoder 203, Huffman table 204, Huffman table ESCR 205, and Huffman table ESCL 206. All Huffman code words, except escape code words of an intra-macro block table B.16 and inter-macro block table B.17, which are described in Annex.B of ISO/IEC14496-2, are registered in the Huffman table 204. For a bitstream input from the queuing means 201, it is determined whether the bitstream coincides with all Huffman code words. If the bitstream coincides with all Huffman code words, corresponding symbol data, Huffman code word length, and a hit signal representing coincidence are asserted.

Even in the Huffman table ESCR 205 and Huffman table ESCL 206, all Huffman code words, except escape code words of the table B.16 and the table B.17 are registered. However, in the Huffman table ESCR 205, an input bitstream is compared with a code word obtained by adding an escape code word +"0" before each Huffman code word, and in the Huffman table ESCL 206, an input bitstream is compared with a code word obtained by adding an escape code word +"10" before each Huffman code word, unlike the Huffman table 204.

The FLC decoder 203 decodes the symbol data when the input bitstream starts with escape code word +"11". In a code word which starts with escape code word +"11", a run length, level, and event with a fixed length follow. Hence, the data at a corresponding bit position is directly output as symbol data.

The selection means 208 selects and outputs symbol data and code word length, which are input from an asserted block, in the bit signals parallelly input from the four blocks, i.e., the FLC decoder 203, Huffman table 204, Huffman table ESCR 205, and Huffman table ESCL 206.

When a variable-length encoding apparatus is constructed by hardware, all Huffman code words in the table B.16 and table B.17 are configured by a ROM or hardwired. When the variable-length decoding apparatus shown in FIG. 2 is implemented by hardware, a Huffman table formed from a ROM or hardwired must be prepared in each of the three blocks, i.e., the Huffman table 204, Huffman table ESCR 205, and Huffman table ESCL 206. Hence, the gate scale becomes large.

In a playback apparatus which must execute real-time processing, high-speed decoding processing is required. In this case, a very large load acts on the logic of the output stage from the queuing means 201, and it is therefore difficult to increase the operating frequency. When decoding processing is implemented by software by using a prior art, for a bitstream encoded using the Huffman table ESCR 205, the input code word is compared with all the Huffman table 204, Huffman table ESCR 205, and Huffman table ESCL 206. Since enormous comparison calculation is necessary, real-time decoding can hardly be implemented.

SUMMARY OF THE INVENTION

The present invention has been made in consideration of the above-described problems, and has as its object to provide a technique for decoding a variable-length code by using a small number of Huffman tables.

In order to solve the above problems, a variable-length code decoding apparatus according to the present invention has, e.g., the following arrangement.

A variable-length code decoding apparatus which receives a bitstream of variable-length-encoded image data and outputs symbol data comprises:

queuing means for queuing a variable-length code word from the received bitstream;

discrimination means for discriminating a type of a code word in accordance with a pattern of a predetermined number of bits at a start of the variable-length code word queued by the queuing means;

extraction means for extracting data having a sufficient code word length from a predetermined bit position on the basis of a discrimination result from the discrimination means;

a Huffman table which compares the extracted data with a variable-length code word stored in advance, and when the data and the variable-length code word coincide, outputs first symbol data;

addition arithmetic means for generating, for the first symbol data output from the Huffman table, a sum value corresponding to the first symbol data and adding the generated sum value to the first symbol to output a plurality of types of second symbol data;

decoding means for selecting a predetermined bit lane from the variable-length code word queued by the queuing means and outputting the bit lane as third symbol data; and selection means for selecting and outputting one of the first symbol data output from the Huffman table, the second symbol data generated by the addition arithmetic means, and the third symbol data generated by the decoding means, in accordance with a value of the variable-length code word queued by the queuing means.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 7 is a view showing a table representing the types of symbol data corresponding to the VLC, ESCL, and ESCR methods;

FIG. 8 is a view showing a fixed-length code table of the FLC method; and

DETAILED DESCRIPTION OF THE PREFERRED EMBODIMENT

An embodiment according to the present invention will be described below in detail with reference to the accompanying drawings.

Figure 1:
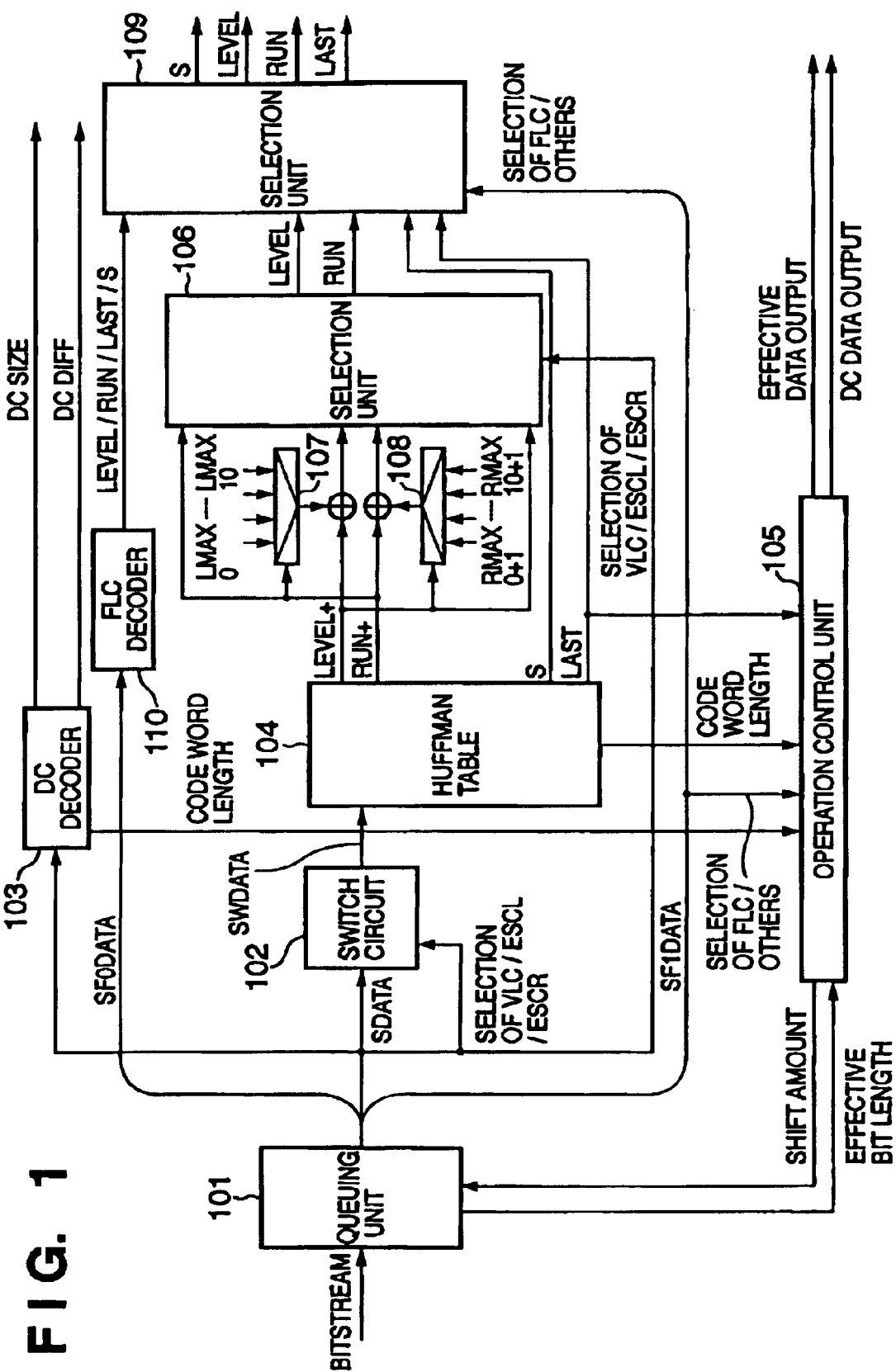
FIG. 1 is a block diagram of a variable-length decoding apparatus according to an embodiment.

FIG. 1 is a block diagram of a variable-length decoding apparatus according to this embodiment.

This variable-length decoding apparatus decodes a bitstream which is encoded by MPEG-4 encoding. In this embodiment, decoding for an intra-macro block will specially be described for a descriptive convenience. However, the present invention is not limited to this, as is apparent from the following description.

The bitstream of a block layer extracted from a bitstream analyzing unit (not shown) is input to a queuing unit 101. The queuing unit 101 includes a shifter. The queuing unit 101 shifts the received bitstream in accordance with a shift amount input from an operation control unit 105 and discards a previous code word in response to each clock. The shift amount corresponds to a code word length. Hence, in the bitstream output from the queuing unit 101, the code word is always queued.

Figure 3:
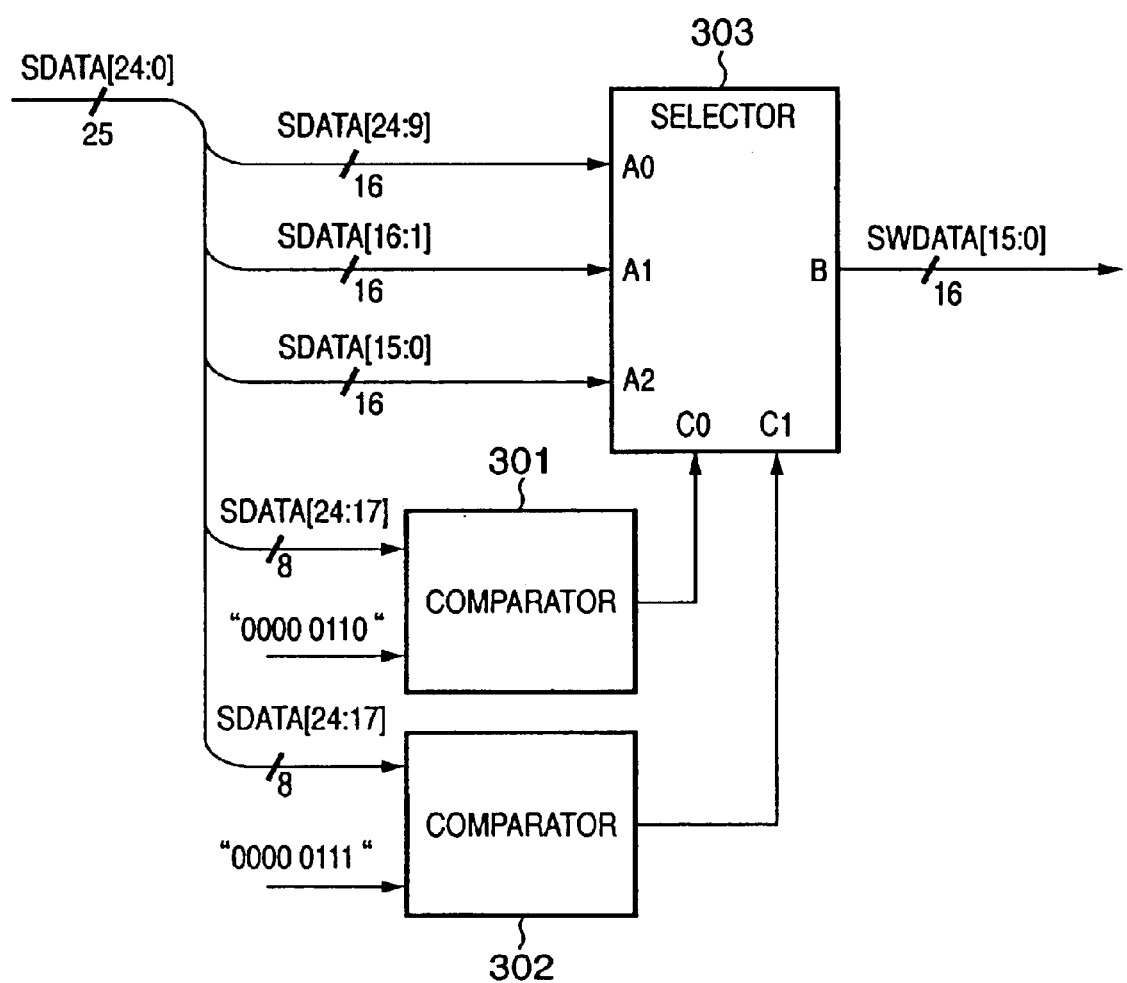
FIG. 3 is a block diagram showing the internal arrangement of a switch circuit shown in FIG. 1.

FIG. 3 shows the arrangement of a switch circuit 102. When 25-bit data is input from the MSB side of the output of the queuing unit, which corresponds to SDATA[24:0] in FIG. 3, comparators 301 and 302 determine whether 8-bit data "00000110" and "00000111" obtained by concatenating 7-bit data "0000011" corresponding to an escape code in MPEG-4 encoding and 1-bit data "0" or "1" coincide with SDATA[24:17] (eight bits from MSB). The data "00000110" is used to detect a code word which is encoded by escape encoding called ESCL encoding. The data "00000111" is used to detect a code word which is encoded by escape encoding called ESCR encoding. Each of the comparators 301 and 302 is simply formed from an AND circuit.

Figure 5:
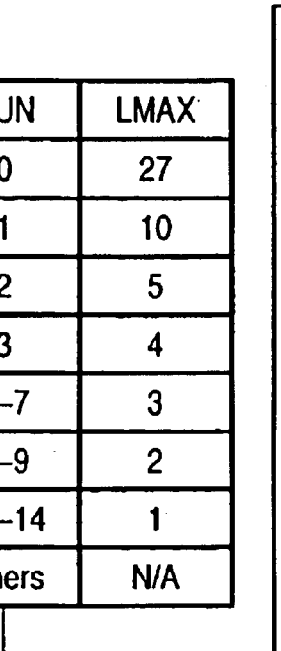
FIG. 5 is a view showing a table representing values of LMAX used in the ESCL method.

In ESCL encoding, Huffman encoding is executed for new symbol data obtained by subtracting a value LMAX shown in FIG. 5 from LEVEL of three-dimensional symbol data of RUN (run length), LEVEL (level), and LAST (last). In ESCR encoding, Huffman encoding is executed for new symbol data obtained by subtracting a value RMAX shown in FIG. 6 from RUN of three-similar dimensional symbol data. The output signals from the comparators 301 and 302 are input to ports C0 and C1 of a selector 303. One of input ports A0 to A2 is selected and output in accordance with IF(C0='1' AND C1='0')//ESCL
  B=A1
ELSE IF(C0='0' AND C1='1')//ESCR
  B=A2
ELSE//VLC
  B=A0

This will briefly be described next.

When eight bits from the start of the 25-bit data coincide with an ESCL code "00000110", 16 bits from bit 16 to bit 1 supplied to the input port A1 are output as SWDATA

[15:0]. When the eight bits coincide with an ESCR code "00000111", 16 bits from bit 15 to bit 0 supplied to the input port A2 are output as SWDATA[15:0]. Otherwise (when C0=C1=0), 16 bits from bit 24 to bit 9 supplied to the input port A0 are output as SWDATA[15:0]. That is, the comparators 301 and 302 discriminate the type of the code word in accordance with the pattern of a predetermined number of bits at the start of the variable-length code word.

A code word corresponding to A0 is a code word obtained by executing corresponding Huffman encoding for three-dimensional data at the time of encoding without subtracting the LMAX or RMAX. In this embodiment, this method will be referred to as VLC encoding hereinafter.

Referring back to FIG. 1, all Huffman code words, except escape codes of an intra-macro block table B.16 described in Annex.B of ISO/IEC14496-2, are stored in a Huffman table 104 by hardwired. It is determined whether the SWDATA [15:0] shown in FIG. 3, which is input from the switch circuit 102, coincides with all the stored Huffman code words. Symbol data corresponding to a Huffman code word that coincides with the input data and the code word length of the Huffman code word are output.

Figure 6:
FIG. 6 is a view showing a table representing values of RMAX used in the ESCR method.

The symbol data to be output from the Huffman table 104 are calculated as three types of symbol data. The three types of symbol data correspond to ESCL encoding, ESCR encoding, and VLC encoding, respectively. A total of four types of data are input to a selection unit 106, which include symbol data RUN+ and LEVEL+ output from the Huffman table 104, data obtained by adding LMAX to LEVEL+, and data obtained by adding RMAX to RUN+. The selection unit 106 selectively outputs two of the four types of data in accordance with the value of SDATA[24:17] as the output signal from the queuing unit 101. The value of LMAX to be added to LEVEL+ is decided in accordance with the values of LAST and RUN+, as shown in FIG. 5. In a selection unit 107, one of 11 values LMAX0 to LMAX11 shown in FIG. 5, which are stored by hardwired in advance, is selected in accordance with the values of LAST and RUN+ and added to LEVEL+. LEVEL+ is expressed by an absolute value. A corresponding code is output from the Huffman table 104 as a symbol S. The value of RMAX to be added to RUN+ is decided in accordance with the values of LAST and LEVEL+, as shown in FIG. 6. In a selection unit 108, one of the values obtained by adding "+1" to 11 values RMAX0 to RMAX11 shown in FIG. 6, which are stored by hardwired in advance, as in the selection unit 107, is selected in accordance with the values of LAST and LEVEL+ and added to RUN+.

On the other hand, the selection unit 106 determines which of the three methods, i.e., VLC, ESCR, and ESCL, has been used to encode the code word currently queued by the queuing unit 101 and selects one of the three types of symbol data, as shown in FIG. 7. The output results from the comparators 301 and 302 used in the switch circuit 102 shown in FIG. 3 may be used for this determination.

Figure 4:
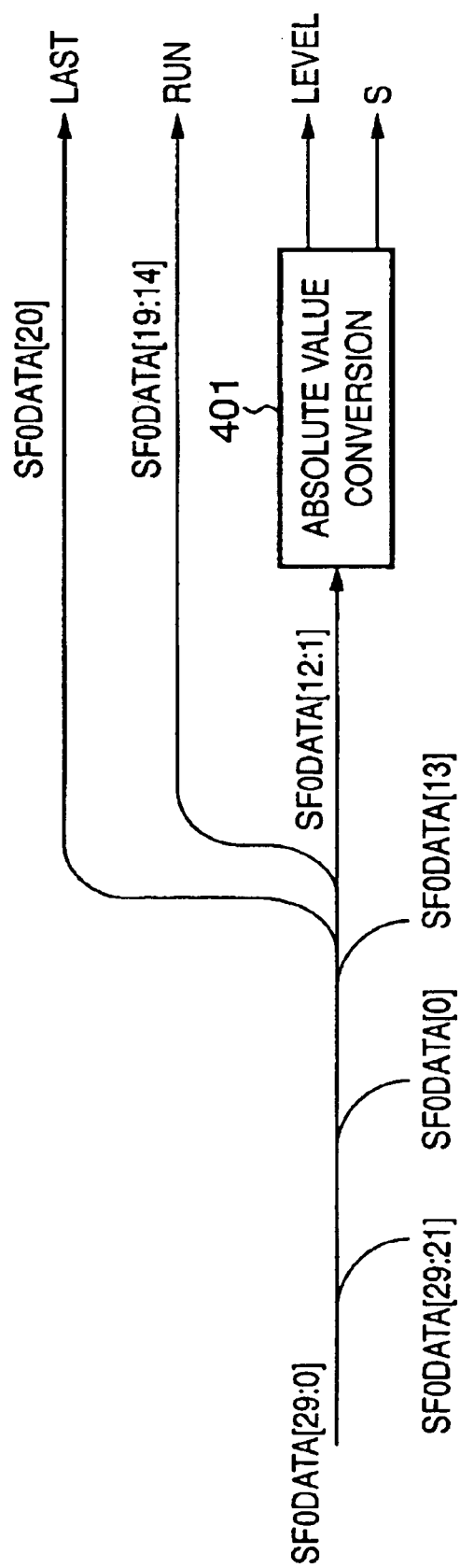
FIG. 4 is a block diagram showing the internal arrangement of an FLC decoder shown in FIG. 1.

An FLC decoder 110 decodes a fixed-length code. In this embodiment, the method using the fixed-length code is called an FLC method, which is executed when none of the VLC, ESCR, and ESCL methods are used for encoding. In the FLC method, symbol data is encoded by using a fixed-length code. Bit lanes corresponding to the symbol data RUN, LEVEL, LAST, and S (sign bit) are selected from the queued code word output from the queuing unit 101, and output. The FLC decoder 110 can have an arrangement shown in FIG. 4. To ensure the consistency to the formats of symbol data of the VLC, ESCR, and ESCL methods, for LEVEL, absolute value conversion is executed, and a code is output.

A selection unit 109 selects one of the two types of symbol data input from the selection unit 106 and FLC decoder 110 in accordance with the value of nine upper bits of the queued code word output from the queuing unit 101. When the nine upper bits are "000001111", the input from the FLC decoder 110 is selected. Otherwise, the input from the selection unit 106 is selected.

The operation control unit 105 first compares the effective bit length input from the queuing unit 101 with the code word length obtained by decoding. If the code word length is equal to or smaller than the effective bit length, it is determined that the decoding processing of the current clock cycle is effective. The effective data output signal is asserted to the block (not shown) on the output side. Pieces of information about the code word length are input from a DC decoder 103 and the Huffman table 104. When the current clock cycle is a DC coefficient decoding cycle, a code word length input from the DC decoder 103 is output as a shift amount. In addition, the DC data output signal is asserted to the block (not shown) on the output side.

When the current clock cycle is an AC coefficient decoding cycle, and the selection unit 109 selects the output from the FLC decoder 110, 30 bits are normally output as a shift amount. Otherwise, a code word length input from the Huffman table 104 is output as a shift amount.

The DC decoder 103 can be formed by using a conventionally known technique, and a description thereof will be omitted in this embodiment.

Figure 9:
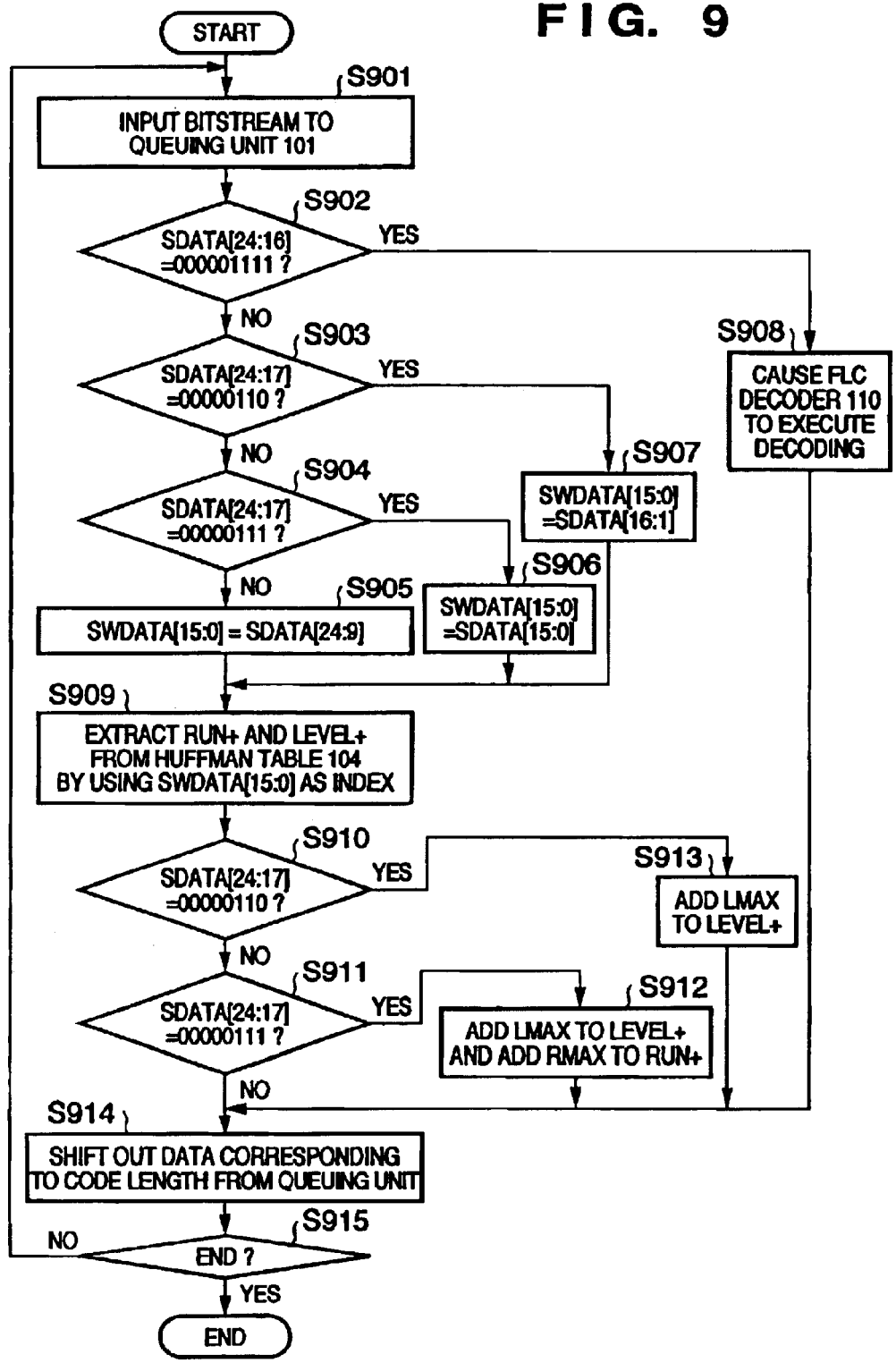
FIG. 9 is a flow chart showing the sequence of processing according to the embodiment.

A processing flow when the constituent elements shown in FIG. 1 are implemented by software modules will be described next. FIG. 9 is a flow chart showing the sequence of processing according to this embodiment, which particularly corresponds to decoding processing for an AC coefficient in a DCT block.

First, in step S901, a bitstream having a desired size is input to the queuing unit 101. This size corresponds to the memory size of the queuing unit and can be implemented by using a prior art, and a description thereof will be omitted.

In step S902, nine bits (nine upper bits) from the MSB of the SDATA[24:0] are compared with "000001111". If they coincide, decoding is executed by the FLC decoder 110. Decoding processing of one AC coefficient is thus ended.

Figure 2:
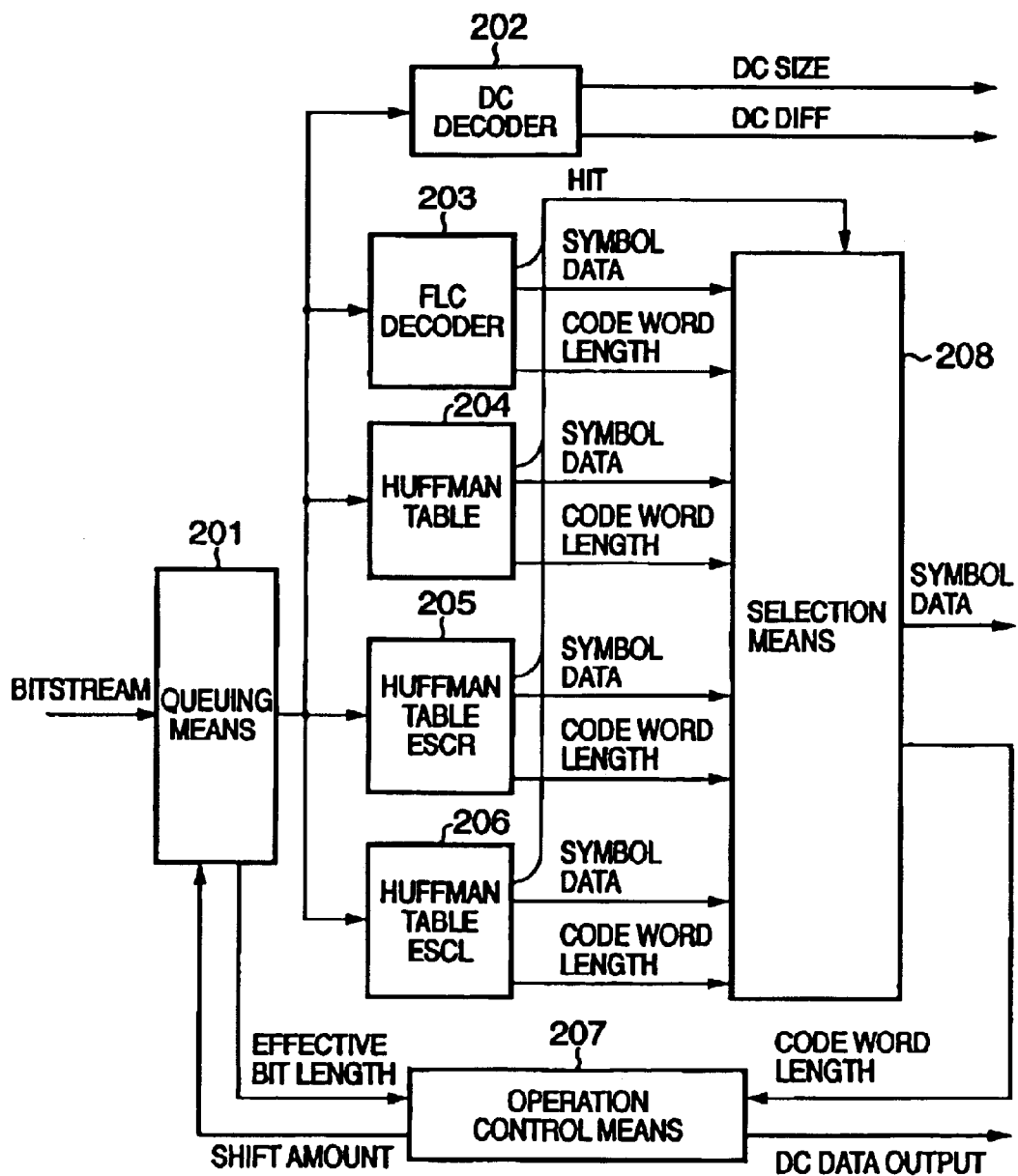
FIG. 2 is a block diagram of a variable-length decoding apparatus using a prior art.

In steps S903 to S907, processing corresponding to the switch circuit 102 is executed. More specifically, in accordance with the value of eight bits from the MSB of the SDATA[24:0], the value of the 16 lower bits of SWADATA [15:0] is set by one of SDATA[24:9], SDATA[15:0], and SDATA[16:1] (steps S905 to S907). By this processing in steps S903 to S907, comparison processing for the three tables, i.e., the Huffman table 204, Huffman table ESCR 205, and Huffman table ESCL 206, which is necessary in the processing of the prior art shown in FIG. 2, can be implemented by only step S909, i.e., lookup table processing for the Huffman table 204 by using SWADATA[15:0].

In steps S910 to S913, processing of the selection units 107 and 108 is implemented for RUN+ and LEVEL+ obtained in step S909 in accordance with the value of eight bits from the MSB of the SDATA[24:0], thereby obtaining RUN and LEVEL as a final decoding result.

In step S914, when the output from the FLC decoder 110 is selected, 30 bits are normally output as a shift-out amount. Otherwise, a code word length input from the Huffman table 104 is output as a shift-out amount.

The above processing is repeated until it is determined in step S915 that the input of bitstream is ended.

As described above, according to this embodiment, the bitstream to be input to the Huffman table 104 is adaptively selected in accordance with the output data from the queuing unit 101. Accordingly, the circuit scale of the Huffman table 104 can actually be reduced to ⅓ or less.

When the constituent elements shown in FIG. 1 are implemented by software modules, the number of processing steps can actually be decreased to ⅓ or less of the prior art.

A computer program normally becomes executable when a computer-readable storage medium such as a CD-ROM is set in a computer, and the program is copied or installed in the system. The present invention also incorporates such a computer-readable storage medium.

As described above, according to the embodiment, the scale of the Huffman table can be reduced. In addition, decoding by software processing can be executed at a high speed.

As many apparently widely different embodiments of the present invention can be made without departing from the spirit and scope thereof, it is to be understood that the invention is not limited to the specific embodiments thereof except as defined in the appended claims.

What is claimed is:

1. A variable-length code decoding apparatus which receives a bitstream of variable-length-encoded image data and outputs symbol data, comprising:
   queuing means for queuing a variable-length code word from the received bitstream;
   discrimination means for discriminating a type of a code word in accordance with a pattern of a predetermined number of bits at a start of the variable-length code word queued by said queuing means;
   extraction means for extracting data having a sufficient code word length from a predetermined bit position on the basis of a discrimination result from said discrimination means;
   a Huffman table which compares the extracted data with a variable-length code word stored in advance, and when the data and the variable-length code word coincide, outputs first symbol data;
   computing means for modifying, for the first symbol data output from said Huffman table, the first symbol data and generating a plurality of types of second symbol data in accordance with the modified first symbol;
   decoding means for selecting a predetermined bit lane from the variable-length code word queued by said queuing means and outputting the bit lane as third symbol data; and
   selection means for selecting and outputting one of the first symbol data output from said Huffman table, the second symbol data generated by said computing means, and the third symbol data generated by said decoding means, in accordance with a value of the variable-length code word queued by said queuing means.

2. The apparatus according to claim 1, wherein the symbol data calculated by said computing means are RUN and LEVEL.

3. The apparatus according to claim 1, wherein said discrimination means discriminates whether the code word is an escape code.

4. The apparatus according to claim 1, wherein the received bitstream is image data encoded by MPEG-4 encoding.

5. A variable-length code decoding method which receives a bitstream of variable-length-encoded image data and decodes the bitstream to at least symbol data, comprising:
   a queuing step, of queuing a variable-length code word from the received bitstream;
   a discrimination step, of discriminating a type of a code word in accordance with a pattern of a predetermined number of bits at a start of the variable-length code word queued in said queuing step;
   an extraction step, of extracting data having a sufficient code word length from a predetermined bit position on the basis of a discrimination result obtained in said discrimination step;
   a Huffman decoding step, of comparing the extracted data with a variable-length code word stored in advance as a Huffman table, and when the data and the variable-length code word coincide, outputting first symbol data;
   a computing step, of modifying, for the first symbol data output in said Huffman decoding step, the first symbol data and generating a plurality of types of second symbol data in accordance with the modified first symbol;
   a decoding step, of selecting a predetermined bit lane from the variable-length code word queued in said queuing step and outputting the bit lane as third symbol data; and
   a selection step, of selecting and outputting one of the first symbol data output from the Huffman table, the second symbol data generated in said computing step, and the third symbol data generated in said decoding step, in accordance with a value of the variable-length code word queued in said queuing step.

6. A computer program which functions as a variable-length code decoding apparatus which receives a bitstream of variable-length encoded image data and outputs symbol data, characterized by functioning as:
   queuing means for queuing a variable-length code word from the received bitstream;
   discrimination means for discriminating a type of a code word in accordance with a pattern of a predetermined number of bits at a start of the variable-length code word cued by said queuing means;
   extraction means for extracting data having a sufficient code word length from a predetermined bit position on the basis of a discrimination result from said discrimination means;
   a Huffman table which compares the extracted data with a variable-length code word stored in advance, and when the data and the variable-length code word coincide, outputs first symbol data;
   computing means for modifying, for the first symbol data output from said Huffman table, the first symbol data and generating a plurality of types of second symbol data in accordance with the modified first symbol;
   decoding means for selecting a predetermined bit lane from the variable-length code word queued by said queuing means and outputting the bit lane as third symbol data;
   selection means for selecting and outputting one of the first symbol data output from said Huffman table, the second symbol data generated by said computing means, and the third symbol data generated by said decoding means, in accordance with a value of the variable-length code word queued by said queuing means.

7. A computer-readable storage medium which stores a computer program of claim 6.

* * * * *

UNITED STATES PATENT AND TRADEMARK OFFICE
CERTIFICATE OF CORRECTION

PATENT NO. : 6,937,170 B2
DATED : August 30, 2005
INVENTOR(S) : Katsumi Otsuka

It is certified that error appears in the above-identified patent and that said Letters Patent is hereby corrected as shown below:

Column 8,
Line 39, "cued" should read -- queued --; and
Line 56, "data;" should read -- data; and --.

Signed and Sealed this

Twenty-eighth Day of February, 2006

JON W. DUDAS
*Director of the United States Patent and Trademark Office*